United States Patent [19]

Skaggs

[11] Patent Number: 4,816,368

[45] Date of Patent: Mar. 28, 1989

[54] MICROENCAPSULATED PHOTOSENSITIVE COMPOSITIONS EMPLOYING IMAGE FORMING INITIATORS

[75] Inventor: Lisa M. Skaggs, Springboro, Ohio

[73] Assignee: The Mead Corporation, Dayton, Ohio

[21] Appl. No.: 12,522

[22] Filed: Feb. 9, 1987

[51] Int. Cl.$^4$ .......................... G03C 1/68; G03C 7/00
[52] U.S. Cl. ................................. 430/138; 430/293; 430/253
[58] Field of Search ....................... 430/138, 293, 253

[56] References Cited

U.S. PATENT DOCUMENTS

| | | | |
|---|---|---|---|
| 3,219,446 | 7/1965 | Berman | 96/28 |
| 3,579,399 | 1/1971 | Chang | 96/74 |
| 3,798,034 | 3/1974 | Laridon | 430/293 X |
| 4,399,209 | 3/1983 | Sanders et al. | 430/138 |
| 4,440,846 | 11/1984 | Sanders et al. | 430/138 |
| 4,501,809 | 2/1985 | Hiraishi et al. | 430/138 |
| 4,608,330 | 8/1986 | Marabella | 430/138 |
| 4,672,014 | 6/1987 | Joiner et al. | 430/138 X |

FOREIGN PATENT DOCUMENTS 0009520 1/1978 Japan .................... 430/293

*Primary Examiner*—Paul R. Michl
*Assistant Examiner*—Cynthia Hamilton
*Attorney, Agent, or Firm*—Smith & Schnacke

[57] ABSTRACT

A photosensitive material comprising a support having a layer of microcapsules on one surface thereof, said microcapsules containing a photocurable composition including a visible initiator dye, said dye directly or indirectly initiating polymerization of said photocurable composition upon exposure to actinic radiation and being essentially the only image-forming agent associated with said microcapsules.

20 Claims, No Drawings

MICROENCAPSULATED PHOTOSENSITIVE COMPOSITIONS EMPLOYING IMAGE FORMING INITIATORS

BACKGROUND OF THE INVENTION

The present invention relates to photosensitive materials employing microencapsulated photosensitive compositions and, more particularly, to materials in which the photoinitiator also functions as the image-forming agent.

Imaging materials which employ microencapsulated photosensitive compositions are known. U.S. Pat. Nos. 4,399,209 and 4,440,846 to the Mead Corporation describe imaging materials in which images are formed by exposure controlled release of an image-forming agent from a microcapsule containing a photocurable composition. The image-forming agent is a substantially colorless compound which forms a colored image or mark when it contacts a developer material. In U.S. Pat. No. 4,440,846, the developer is on the same sheet as the microcapsules. In U.S. Pat. No. 4,399,209, it is on a separate sheet.

U.S. Pat. No. 3,219,446 to Berman discloses an imaging system which, like the Mead systems, employs a microencapsulated photocurable composition, however, unlike Mead's systems, Berman's system uses a colored dye. The release of the dye from the microcapsules is disclosed as being controlled by exposure of the photocurable composition. The dye is differentially transferred to plain paper where the image is formed.

U.S. Pat. No. 3,579,399 to Chang et al. discloses an imaging material in which the photosensitive layer is a dispersion of microdroplets of a photohardenable composition containing a color coupler in a binder. Exposure renders the droplets impermeable to a photographic developer which is applied later and which reacts with the color coupler in the unexposed droplets to produce a color image. Chang et al. describe a full color, panchromatic imaging material in which the photocurable compositions are sensitized by initiator dyes which are bleached upon exposure. The color coupler image is controlled by the polymerization initiated by the bleached dye.

SUMMARY OF THE INVENTION

The present invention is directed to a photosensitive material employing a layer of microencapsulated photocurable composition wherein the photocurable composition includes an initiator dye which, upon exposure, initiates polymerization (or more correctly interacts with other compounds to initiate polymerization) and which also function as the image-forming agent. These photosensitive materials are advantageous because they can be used to form images directly on plain paper without an image-forming agent and they represent a simplificiation over the Mead and Chang systems described in the aforementioned patents because they obviate the need for a color developer.

The photosensitive material of the present invention is sensitive to visible light. These materials may be designed to produce monochromatic, polychromatic, or full color images. For optimum image stability, an initiator dye is selected which initiates polymerization but which is not bleached upon exposure to light. The mechanism whereby exposure controls the formation of the image is described in the Mead patents. In the fully exposed areas, the internal phase of the microcapsules is hardened and the initiator dye is not released upon application of pressure or an equivalent uniform rupturing force to the microcapsules. In the unexposed and underexposed areas, the internal phase is released from the microcapsules and transferred to a receiver sheet where the initiator dye forms the image. Transfer of the initiator dye from the unexposed and underexposed microcapsules can be effected to coated or uncoated paper or to a transparency. After transfer, further exposure of the transferred composition cures it on the receiver sheet surface. Full color systems can be designed by using cyan colored, magenta colored and yellow colored initiator dyes.

Accordingly, one object of the present invention is to provide photosensitive material employing an encapsulated photocurable composition containing an initiator dye wherein said initiator dye directly or indirectly initiates polymerization of the photocurable composition and also functions as the image-forming agent.

More particulary, the present invention has as an object providing an imaging sheet which is useful in a process comprising the steps of image-wise exposing the imaging sheet to actinic radiation, assembling the imaging sheet with a receiver sheet, and subjecting the microcapsules to a uniform rupturing force whereupon they rupture and differentially release the photocurable composition to the surface of the receiver sheet wherein the initiator dye released form the microcapsules forms the image.

Still more particulary, the present invention has as an object providing an imaging sheet and a method for forming images on a non-reactive substrate such as plain paper or a transparent film without the use of dye precursors, color formers, or the like.

Accordingly, one embodiment of the present invention resides in a photosensitive material comprising a support having a layer of microcapsules on one surface thereof, said microcapsules containing a photocurable composition including a visible initiator dye, said dye directly or indirectly initiating polymerization of said photocurable compositon upon exposure to actinic radiation and being essentially the only image-forming agent associated with said microcapsules.

Still another embodiment of the present invention resides in a process for forming images which comprises the steps of image-wise exposing the aforesaid photosensitive material to actinic radiation, assembling said photosensitive material with a non-reactive receiver sheet such as plain paper such that said layer of microcapsules is in contact with the receiver sheet, and subjecting the layer of microcapsules to a uniform rupturing force.

DEFINITIONS

The term "microcapsules" as used herein refers both to microcapsules having a discrete wall, e.g., a wall of the type illustrated in U.S. Pat. No. 2,374,862 to Green et al. and to microcapsules consisting of a dispersion of the photocurable compositon in a binder.

The term "photocurable" refers to materials which are polymerized and/or crosslinked upon exposure to actinic radiation.

The term "actinic radiation" includes the entire electromagnetic energy spectrum, but principally visible light and ultraviolet radiation. Laser emissions are included.

DETAILED DESCRIPTION OF THE INVENTION

The initiator dyes used in the present invention are characterized in that they are visible dyes capable of initiating free radical polymerization alone or in combination with a coinitiator or hydrogen donor compound and/or an autoxidizer. They may be of any color and any chemical class. Both photoreducible and photooxidizable dyes are useful. The preferred dyes are not bleached or only slowly bleached upon exposure. Where the image is designed to be temporary only, bleachable dyes could be used. When the image is designed to be a non-permanent, temporary image, e.g., in a visitor's security badge or the like, bleachable dyes can be used.

Specific classes of dyes useful in the present invention are methine, polymethine, triacylmethane, indoline, thiazine, xanthene, oxazine, and acridine and, more particularly, cyanine, carbocyanine, hemicyanine, rhodamine, and azomethine dyes.

Examples of dyes useful in the present invention are described in a literature survey, Eaton, "Dye Sensitized Polymerization", *Advances in Photochemistry*, Vol. 13. Further examples are provided in the following U.S. Pat. Nos.: 2,850,445; 2,875,047; 3,097,096; 3,531,281; 3,547,633; 3,556,790; 3,556,794; 3,573,992; 3,597,204; 3,597,343; 3,598,584; 3,607,272; 3,642,487; 3,649,495.

Photoreducible and photooxidizable dyes are used in combination with an activator or coinitiator which functions as a hydrogen donor or an electron donor, respectively. Typical examples of activators are also provided in the Eaton paper. Representative examples are amines such as triethanolamine, and sulfinates such as p-toluenesulfinate sodium salt. For high photographic sensitivity an autoxidizer is used.

A particularly preferred initiator dye for use in the present invention is an ionic dye-reactive counter ion complex or compound. These compounds are described in commonly assigned U.S. Application Ser. No. 917,873 filed Oct. 10, 1986 and Ser. No. 944,305 filed Dec. 18, 1986 which are incorporated herein by reference.

A particularly useful example of an ionic dye-counter ion compound useful in the present invention is a cationic dye-borate anion complex of the formula (I)

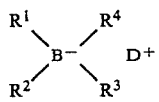

where $D^+$ is a cationic dye; and $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups. Preferably, at least one but not more than three of $R^1$, $R^2$, $R^3$, and $R^4$ is an alkyl group. For example particularly preferred anions are triphenylbutylborate and trianisylbutylborate anions because they readily dissociate to triphenylborane or trianisylborane and a butyl radical.

Useful dyes are cationic dyes of the aforementioned types which form photoreducible but dark stable complexes with borate anions. Cyanine dyes are preferred.

Anionic dye compounds are also useful in the present invention. Anionic dye-iodonium ion compounds of the formula (IV):

$$[R^5-I\oplus-R^6]_n D^{-n} \qquad (IV)$$

where $D^-$ is an anionic dye and $R^5$ and $R^6$ are independently selected from the group consisting of aromatic nucleii such as phenyl or naphthyl and n is 1 or 2; and anionic dye-pyryllium complex or compounds of the formula (V):

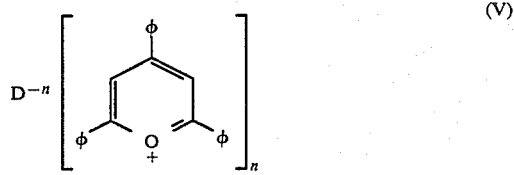

where $D^-$ and n are as defined above are typical examples of anionic dye complexes or compounds.

Representative examples of anionic dyes include xanthene and oxonols. In addition to iodonium and pyryllium ions, other compounds of anionic dyes and sulfonium and phosphonium cations are potentially useful.

Specific examples of initiator dyes useful in the present invention are shown in Table 1 and Table 2 below.

TABLE 1

| Compound No. | Structure | λmax (TMPTA) |
|---|---|---|
| 1. | 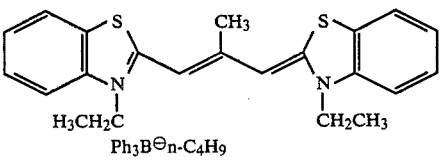 Ph₃B⊖n-C₄H₉ | 552 nm |
| 2. | 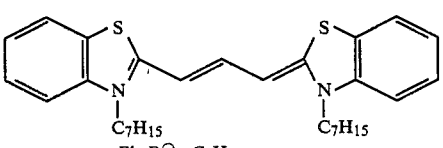 Ph₃B⊖n-C₄H₉ | 568 nm |

TABLE 1-continued
3. 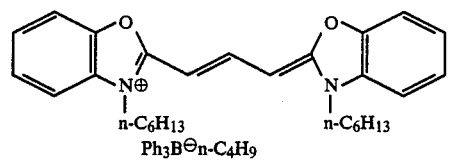 492 nm
4. 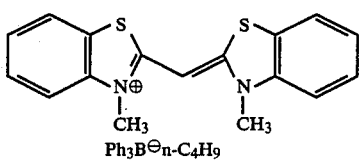 428 nm
5. 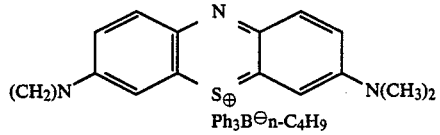 658 nm
6. 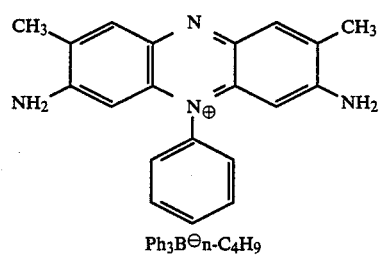 528 nm
7. 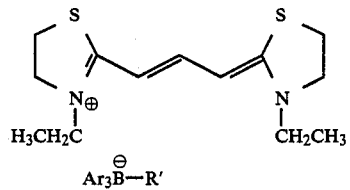 450 nm
|    | R'      | Ar     |
|----|---------|--------|
| 7A | n-butyl | phenyl |
| 7B | n-hexyl | phenyl |
| 7C | n-butyl | anisyl |
8. 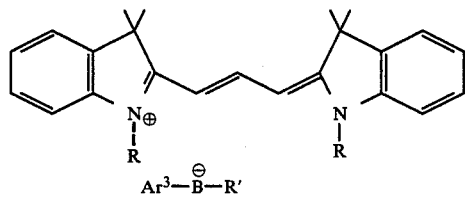 550 nm
|    | R'       | R       | Ar     |
|----|----------|---------|--------|
| 8A | methyl   | n-butyl | phenyl |
| 8B | methyl   | n-hexyl | phenyl |
| 8C | n-butyl  | n-butyl | phenyl |
| 8D | n-butyl  | n-hexyl | phenyl |
| 8E | n-heptyl | n-butyl | phenyl |
| 8F | n-heptyl | n-hexyl | phenyl |
| 8G | ethyl    | n-butyl | phenyl |

TABLE 1-continued

9. 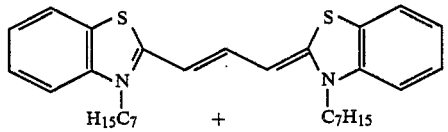 570 nm System

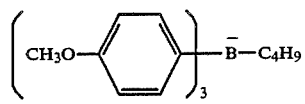

10. 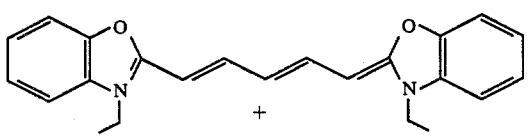 590 nm System

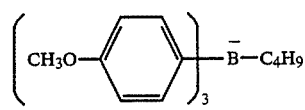

11. 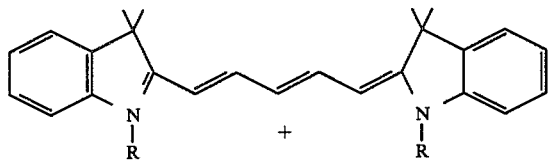 640 nm $Ar_3B^-—R'$

|  | R | R' | Ar |
|---|---|---|---|
| 11A | methyl | n-butyl | phenyl |
| 11B | methyl | n-hexyl | phenyl |
| 11C | n-butyl | n-butyl | phenyl |
| 11D | n-butyl | n-hexyl | phenyl |
| 11E | n-pentyl | n-butyl | phenyl |
| 11F | n-pentyl | n-hexyl | phenyl |
| 11G | n-heptyl | n-butyl | phenyl |
| 11H | n-heptyl | n-hexyl | phenyl |
| 11I | methyl | n-butyl | anisyl |

12. 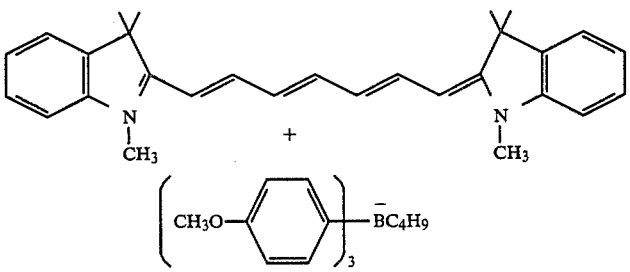 740 nm System

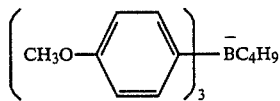

Selected examples of anionic dye compounds are shown in Table 2 (λmax. ca. 570 nm in TMPTA). In Table 2 the symbol φ is used for a phenyl group and the structure

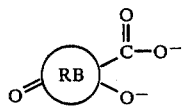

is used for

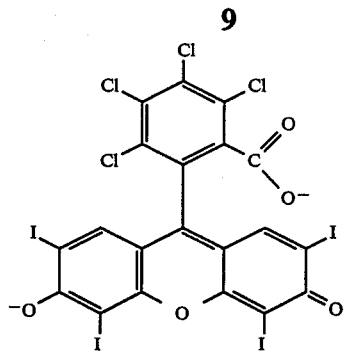

TABLE 2

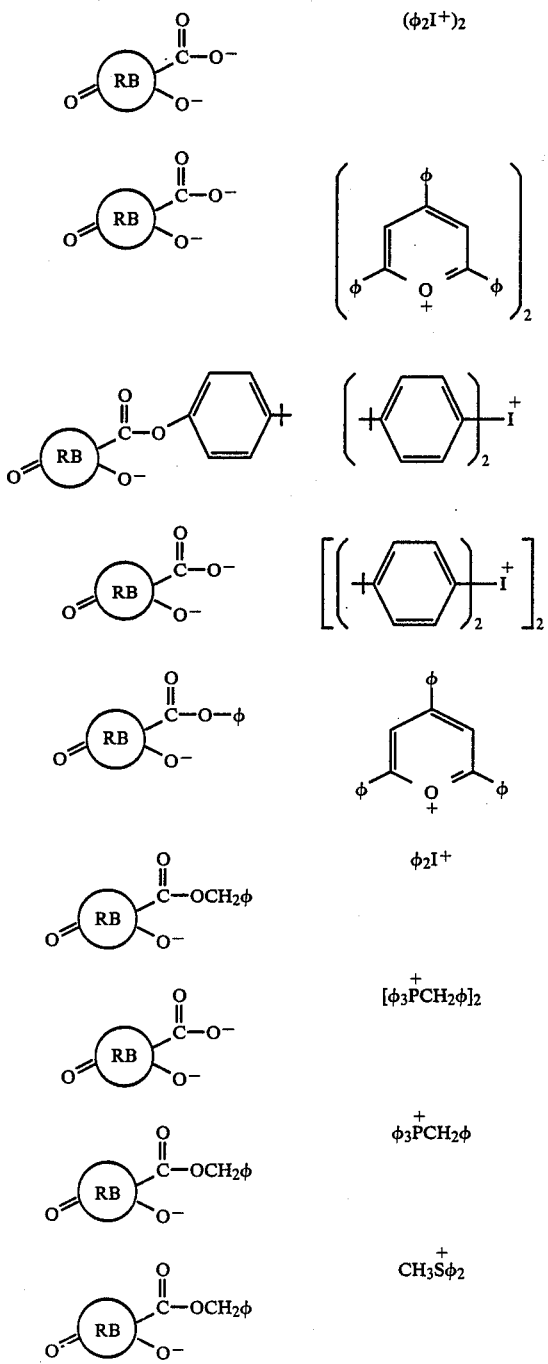

TABLE 2-continued

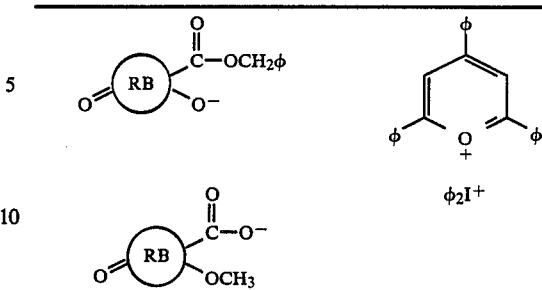

The most typical examples of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

The initiator dye is usually used in an amount up to about 5% by weight based on the weight of the photopolymerizable or crosslinkable species in the photohardenable composition. More typically, the compound is used in an amount of about 0.2 to 2.0% by weight.

Because free radical polymerization is subject to inhibition by ambient oxygen, it has been found that it is preferable to use the initiator dye in combination with an autoxidizer. An autoxidizer is a compound which is capable of consuming oxygen in a free radical chain process.

Examples of useful co-initiators and autoxidizers are N,N-dialkylanilines. For a detailed discussion of these compounds see U.S. Application Serial No. 755,400, filed July 16, 1985. An autoxidizer is a compound which is characterized by an efficient autoxidative reaction. A co-initiator is characterized as an efficient hydrogen donor. Examples of preferred N,N-dialkylanilines are dialkylanilines substituted in one or more of the ortho-, meta-, or para- position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Preferred N,N-dialkylanilines are substituted with an alkyl group in the ortho-position and include 2,6-diisopropyl-N,N- dimethylaniline, 2,6-diethyl-N,N-dimethyl- aniline, N,N,2,4,6-pentamethylaniline (PMA) and p-t-butyl-N,N-dimethylaniline. In selecting autoxidizers and co-initiators for use in the present invention, reactivity with the initiator dye should be minimized.

The autoxidizers and co-initiators are preferably used in the present invention in concentrations of about 4–5% by weight.

Photocurable composition can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which are responsive to changes in the internal phase viscosity in terms of their ability to rupture.

Oil soluble materials have been encapsulated in hydrophilic wall-forming materials such as gelatin-type materials (see U.S. Pat. Nos. 2,730,456 and 2,800,457 to Green et al) including gum arabic, polyvinyl alcohol, carboxy-methylcellulose; resorcinol-formaldehyde wall formers (see U.S. Pat. No. 3,755,190 to Hart, et al); isocyanate wall-formers (see U.S. Pat. No. 3,914,511 to Vassiliades); isocyanate-polyol wall-formers (see U.S. Pat. No. 3,796,669 to Kirintani et al); urea-formaldehyde wall-formers, particularly urea-resorcinol-formaldehyde in which oleophilicity is enhanced by the addition of resorci- nol (see U.S. Pat. Nos. 4,001,140; 4,087,376 and 4,089,802 to Foris et al. and U.S. Pat. No. 4,603,330 to Marabella); and melamine-formaldehyde resin and hydroxypropyl cellulose (see commonly assigned U.S. Pat. No. 4,025,455 to Shackle).

Urea-resorcinol-formaldehyde and melamineformaldehyde capsules with low oxygen permeability are preferred. In some cases to reduce oxygen permeability it is desirable to form a double walled capsule by conducting encapsulation in two stages.

A capsule size should be selected which minimizes light attenuation. The mean diameter of the capsules used in this invention typically ranges from approximately 1 to 25 microns. As a general rule, image resolution improves as the capsule size decreases. If the capsules become too small, they may become inaccessible in the pores or the fiber of the substrate. These very small capsules may therefore be screened from exposure by the substrate. They may also fail to rupture when exposed to pressure or other rupturing means. In view of these problems, it has been determined that a preferred mean capsule diameter range is from approximately 10 microns. Technically, however, the capsules can range in size up to the point where they become visible to the human eye.

An open phase system may also be used in accordance with the invention instead of an encapsulated one. This can be done by dispersing what would otherwise be the capsule contents throughout the coating on the substrate as discrete droplets. Suitable coatings for this embodiment include polymer binders whose viscosity has been adjusted to match the dispersion required in the coating. Suitable binders are gelatin, polyvinyl alcohol, polyacrylamide, and acrylic lattices.

Photosensitive materials in accordance with the present invention can be used to provide images on a variety of substrates. Because the initiator dye functions as the image-forming agent, it is not necessary to use reactive receiver sheets such as papers coated with developer materials. Images can be formed on plain paper, cast coated paper, papers treated to enhance the gloss or reduce blocking, and transparent films such as PET and the like.

Where the photosensitive material is used to form monochromatic images, imaging is simply a process for forming exposed and unexposed areas, assembling the photosensitive material with a receiver sheet and subjecting the assembly to a uniform rupturing force such as pressure.

The synthesis of initiator dyes useful in the present invention is illustrated in the following Synthesis Examples:

SYNTHESIS EXAMPLE 1

Dissolve triphenylborane in 150 ml dry benzene (1M) under nitrogen atmosphere. Place flask in a cool water bath and, while stirring, add n-BuLi, (1.1 eg.) via syringe. A white precipitate soon formed after addition was started. Stirring is continued about 45–60 min. Dilute with 100 ml hexane and filter, washing with hexane. This resultant Li salt is slightly air unstable. Dissolve the white powder in about 200 ml distilled water and, with vigorous stirring, add aqueous solution of tetramethyl ammonium chloride (1.2 eg. of theoretical in 200 ml). A thick white precipitate forms. Stir this aqueous mixture about 30 min. at room temperature, then filter. Wash collected white solid with distilled water.

As an alternative synthesis, to a 1.0M solution of 2.0 equivalents of 1-butene in dry, oxygen-free dichloromethane, under inert atomosphere, was added slowly dropwise with stirring, 1.0 equivalents of a 1.0M solution of dibromethane-methylsulfide complex in dichloromethane. The reaction mixture stirred at reflux for 36 hours and the dichloromethane and excess 1-butene were removed by simple distillation. Vacuum distillation of the residue afforded 0.95 equivalents of a colorless mobile oil (Bp 66–7 0.35 mm Hg, "BNMR;bs (4.83PPM). Under inert atmosphere, this oil was dissolved in dry, oxygen-free tetrahydrofuran to give a 1.0M solution and 3.0 equivalents of a 2.0M solution of phenylmagnesium chloride in tetrahydrofuran were added dropwise with stirring. After stirring 16 hours, the resultant solution was added slowly with vigorous stirring to 2 equivalents of tetramethylammonium chloride, as a 0.2 M solution, in water. The resulting white flocculate solid was filtered and dried to afford a near quantitative amount of the desired product Mp 250-2° C., " BNMR;bs (−3.70PPM).

SYNTHESIS EXAMPLE 2

Sonicate a suspension of a borate salt (1 g/10 ml) in MeOH, to make a very fine suspension. Protect flask from light by wrapping with aluminum foil then add 1 equivalent of dye. Stir this solution with low heat on a hot plate for about 30 min. Let cool to room temperature then dilute with 5–10 volumes of ice water. Filter the resultant solid and wash with water until washings are colorless. Suction filter to dryness. Completely dry initiator compound by low heat (about 50° C.) in a vacuum drying oven. Initiator is usually formed quantitatively. Analysis by H-NMR indicates 1:1 compound formation typically greater than 90%.

The present invention is illustrated in more detail by the following non-limiting theoretical Example.

EXAMPLE

Capsule Preparation

1. Into a 600 ml stainless steel beaker, 104 g water and 24.8 g isobutylene maleic anhydride copolymer (18%) will be weighed.

2. The beaker will be clamped in place on a hot plate under an overhead mixer. A six-bladed, 45° pitch, turbine impeller will be used on the mixer.

3. After thoroughly mixing, 3.1 g pectin (polygalacturonic acid methyl ester) will be slowly sifted into the beaker. This mixture will be stirred for 20 minutes.

4. The pH will be adjusted to 4.0 using a 20% solution of $H_2SO_4$, and 0.1 g Quadrol (2-hydroxypropyl ethylenediamine with propylene oxide from BASF) will be added.

5. The mixer will be turned up to 3000 rpm and the internal phase will be added over a period of 10-15 seconds. Emulsification is continued for 10 minutes.

6. At the start of emulsification, the hot plate will be turned up so heating continues during emulsification.

7. After 10 minutes, the mixing speed will be reduced to 2000 rpm and 14.1 g urea solution (50% w/w), 3.2 g resorcinol in 5 g water, 21.4 g formaldehyde (37%), and 0.6 g ammonium sulfate in 10 ml water will be added at two-minute intervals.

8. The beaker will be covered with foil and a heat gun will be used to help bring the temperature of the preparation to 65° C. When 65° C. is reached, the hot plate will be adjusted to maintain this temperature for a two to three hour cure time during which the capsule walls will be formed.

9. After curing, the heat will be turned off and the pH will be adjusted to 9.0 using a 20% NaOH solution.

10. Dry sodium bisulfite (2.8 g) will be added and the capsule preparation will be cooled to room temperature.

Three batches of microcapsules will be prepared for use in a full color imaging sheet using the three internal phase compositions set forth below. Internal Phase A provides a yellow image and is sensitive at 420 nm, Phase B provides a magenta image and is sensitive at 480 nm, and Phase C provides a cyan image and is sensitive at 570 nm. The three batches of microcapsules will be mixed, coated on a support, and dried to provide a full color imaging sheet.

| Internal Phase A (420 nm) | |
|---|---|
| TMPTA | 35 g |
| DPHPA | 15 g |
| 3-Thenoyl-7-diethylamino coumarin | 15 g |
| 2-Mercaptobenzoxazole (MBO) | 2.0 g |
| Pentamethylaniline (PMA) | 1.0 g |
| SF-50 (Union Carbide Isocyanate) | 1.67 g |
| N-100 (Desmodur Polyisocyanate Resin) | 3.33 g |
| Internal Phase B (480 nm) | |
| TMPTA | 35 g |
| DPHPA | 15 g |
| 9-(4'-Isopropylcinnamoyl)-1,2,4-tetrahydro-3H, 6H, 10H[1]-benzopyrano[9, 9A,1-yl]quinolazine-10-one | 0.15 g |
| MBO | 1.0 g |
| PMA | 2.0 g |
| SF-50 | 1.67 g |
| N-100 | 3.33 g |
| Internal Phase C (570 nm) | |
| TMPTA | 50 g |
| Cationic Dye Compound No. 2 | 0.15 g |
| PMA | 2.0 g |
| SF-50 | 1.67 g |
| N-100 | 3.33 g |

Having described the invention in detail and by reference to preferred embodiments thereof, it will be apparent that modifications and variations are possible without departing from the scope of the invention defined in the appended claims.

What is claimed is:

1. A photosensitive material comprising a support having a layer of microcapsules on one surface thereof, said microcapsules containing a photocurable composition including a visible initiator dye, said dye directly or indirectly initiating free radical polymerization of said photocurable composition upon exposure to actinic radiation and being essentially the only image-forming agent associated with said microcapsules wherein said dye is an ionic dye-reactive counter ion complex.

2. The photosensitive material of claim 1 wherein said dye is not bleached upon exposure to actinic radiation.

3. The photosensitive material of claim 2 wherein said photocurable composition includes an ethylenically unsaturated compound.

4. The photosensitive material of claim 1 wherein said material is capable of forming images by a process including the steps of image-wise exposing said photosensitive material to actinic radiation, assemblying said photosensitive material with a receiver sheet, and subjecting said layer of microcapsules to a uniform rupturing force such that said microcapsules image-wise release said photocurable composition and said composition is transferred to said receiver sheet.

5. The photosensitive material of claim 4 wherein said dye is a photoreducible or photooxidizable dye.

6. The photosensitive material of claim 5 wherein said microcapsules have a discrete wall.

7. The photosensitive material of claim 5 wherein said microcapsules are formed by dispersing said photocurable composition in a binder.

8. A process for forming images which comprises image-wise exposing a photosensitive material comprising a support having a layer of microcapsules on one surface thereof, said microcapsules containing a photocurable composition including a visible initiator dye, said dye directly or indirectly initiating free radical polymerization of said photocurable composition upon exposure to actinic radiation, and said dye being essentially the only image-forming agent associated with said microcapsules wherein said dye is an ionic dye-reactive counter ion complex;
assembling the exposed photosensitive material with a receiver sheet; and
subjecting said layer of microcapsules to a uniform rupturing force.

9. The process of claim 8 wherein said dye alone or in combination with a co-initiator generates free radicals, and said photocurable composition includes an ethylenically unsaturated compound.

10. The process of claim 9 wherein said dye is a photoreducible or photooxidizable dye.

11. The process of claim 10 wherein said microcapsules include a discrete wall.

12. The photosensitive material of claim 1 wherein said visible initiator dye is a cationic dye-borate anion complex.

13. The photosensitive material of claim 1 wherein said visible initiator dye is an anionic dye-onium ion complex or an anionic dye-pyrylium complex.

14. The photosensitive material of claim 12 wherein said cationic dye is a cyanine dye.

15. The photosensitive material of claim 12 wherein said anionic dye is Rose Bengal.

16. The process of claim 8 wherein said ionic dye-reactive counter ion complex is a cationic dye-borate anion complex or an anionic dye-onium complex or an anionic dye-pyryllium complex.

17. The process of claim 16 wherein said ionic dye-reactive counter ion complex is a cationic cyanine dye-borate anion complex.

18. The process of claim 17 wherein said ionic dye-reactive counter ion complex is a Rose Bengal complex.

19. The photosensitive material according to claim 1 wherein said microcapsules include a first, a second, and a third set of microcapsules respectively containing a cyan, a magenta, and a yellow initiator dye.

20. The process of claim 8 wherein said microcapsules include a first, a second, and a third set of microcapsules respectively containing a cyan, a magneta, and a yellow initiator dye.

* * * * *